United States Patent
Masuda et al.

(10) Patent No.: US 11,899,043 B2
(45) Date of Patent: Feb. 13, 2024

(54) CURRENT DETECTION APPARATUS AND POWER SUPPLY CONTROL APPARATUS

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Ryosuke Masuda, Yokkaichi (JP); Masayuki Kato, Yokkaichi (JP); Shunichi Sawano, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 288 days.

(21) Appl. No.: 17/605,466

(22) PCT Filed: Apr. 14, 2020

(86) PCT No.: PCT/JP2020/016364
§ 371 (c)(1),
(2) Date: Oct. 21, 2021

(87) PCT Pub. No.: WO2020/218077
PCT Pub. Date: Oct. 29, 2020

(65) Prior Publication Data
US 2022/0308092 A1    Sep. 29, 2022

(30) Foreign Application Priority Data

Apr. 26, 2019   (JP) .................................. 2019-085995

(51) Int. Cl.
*G01R 15/14*   (2006.01)
*G01R 19/25*   (2006.01)

(52) U.S. Cl.
CPC ....... *G01R 15/146* (2013.01); *G01R 19/2513* (2013.01)

(58) Field of Classification Search
CPC .. G01R 15/146; G01R 19/2513; G01R 1/203; G01R 19/0092
(Continued)

(56) References Cited

U.S. PATENT DOCUMENTS 11,099,216 B2 *   8/2021   Panine ............... G01R 19/0092
2016/0356825 A1 *  12/2016   Bae ..................... H03F 3/45475
(Continued)

FOREIGN PATENT DOCUMENTS

| JP | 2001-349907 A | 12/2001 |
|----|---------------|---------|
| JP | 2006-047111 A | 2/2006 |

(Continued)

OTHER PUBLICATIONS

International Search Report, Application No. PCT/JP2020/016364, dated Jul. 21, 2020. ISA/Japan Patent Office.

*Primary Examiner* — Giovanni Astacio-Oquendo
(74) *Attorney, Agent, or Firm* — Honigman LLP

(57) ABSTRACT

Provided is current detection apparatus for detecting current flowing through a power supply path of a power supply control apparatus. The power supply path includes a first conductor and a second conductor. The current detection apparatus includes: a first and a second shunt resistor connected in parallel between the first and the second conductor, and a current detection circuit detecting: (1) current flowing through the first shunt resistor; and (2) current flowing from the first to the second conductor via both the first and second shunt resistors. The current detection apparatus further includes an arithmetic circuit that calculates current flowing through the power supply path based on a correlative relationship between the current (Continued)

flowing from the first to the second conductor via both the first and the second shunt resistor and current flowing through the first shunt resistor, and the current detected by the current detection circuit.

15 Claims, 3 Drawing Sheets

(58) Field of Classification Search
USPC .................................. 324/76.11, 71.5, 71.1
See application file for complete search history.

(56) References Cited

U.S. PATENT DOCUMENTS

| | | |
|---|---|---|
| 2019/0260200 A1 | 8/2019 | Sawano et al. |
| 2023/0204631 A1* | 6/2023 | Takigashira ....... G01R 19/0023 324/126 |

FOREIGN PATENT DOCUMENTS

| | | |
|---|---|---|
| JP | 2008-047571 A | 2/2008 |
| JP | 2011-059085 A | 3/2011 |
| JP | 2018-173360 A | 11/2018 |

* cited by examiner

CURRENT DETECTION APPARATUS AND POWER SUPPLY CONTROL APPARATUS

CROSS-REFERENCE TO RELATED APPLICATIONS

This application is the U.S. national stage of PCT/JP2020/016364 filed on Apr. 14, 2020, which claims priority of Japanese Patent Application No. JP 2019-085995 filed on Apr. 26, 2019, the contents of which are incorporated herein.

TECHNICAL FIELD

The present disclosure relates to a current detection apparatus and a power supply control apparatus.

BACKGROUND

A vehicle is equipped with a power supply control apparatus that controls power supply from a battery to a load. The power supply control apparatus includes a semiconductor switching element such as a power MOSFET (Metal Oxide Semiconductor Field Effect Transistor) connected to a power supply path, and performs power supply control through PWM (Pulse Width Modulation) control of the semiconductor switching element. Also, the power supply control apparatus includes a current detection apparatus that detects current in the power supply path. A current detection circuit includes a shunt resistor connected in series with the semiconductor switching element, and can detect the current in the power supply path based on the voltage across the shunt resistor.

If a voltage drop that occurs in the shunt resistor is a predetermined threshold value or more, the power supply control apparatus turns off the semiconductor switching element to protect itself from overcurrent. Also, the power supply control apparatus estimates the wire temperature based on the current value detected by the current detection circuit and the current application time, and turns off the semiconductor switching element to protect the wire if the estimated wire temperature is a predetermined threshold value or more.

When many loads are mounted in a vehicle or the amount of power consumed by a load becomes large, there is a technical problem in that the current flowing through the power supply path increases and the heat generated by a shunt resistor also increases. Although it is also conceivable that multiple shunt resistors are connected in parallel such that the temperature of the shunt resistor does not exceed the heat resistance temperature, it is necessary to provide a current detection circuit for each shunt resistor, thereby incurring an increase in the number of components, an increase in the circuit mounting area on the substrate, and an increase in arithmetic processing.

An object of the present disclosure is to provide a current detection apparatus and a power supply control apparatus according to which it is possible to detect a large current that cannot be detected with one shunt resistor, by merely providing one current detection circuit for a plurality of shunt resistors connected in parallel.

SUMMARY

The current detection apparatus according to the present aspect is a current detection apparatus for detecting current flowing through a power supply path of a power supply control apparatus, in which the power supply path includes a first conductor and a second conductor, the current detection apparatus further includes: a first shunt resistor and a second shunt resistor that are connected in parallel between the first conductor and the second conductor; a current detection circuit configured to detect current flowing through the first shunt resistor; and an arithmetic circuit, and the arithmetic circuit calculates current flowing through the power supply path based on a correlation between current flowing from the first conductor to the second conductor via both the first shunt resistor and the second shunt resistor and current flowing through the first shunt resistor, and the current detected by the current detection circuit

Effect of the Disclosure

According to the present disclosure, it is possible to provide a current detection apparatus and a power supply control apparatus according to which it is possible to detect a large current that cannot be detected with one shunt resistor, by merely providing one current detection circuit for a plurality of shunt resistors connected in parallel.

DETAILED DESCRIPTION OF PREFERRED EMBODIMENTS

Figure 1:
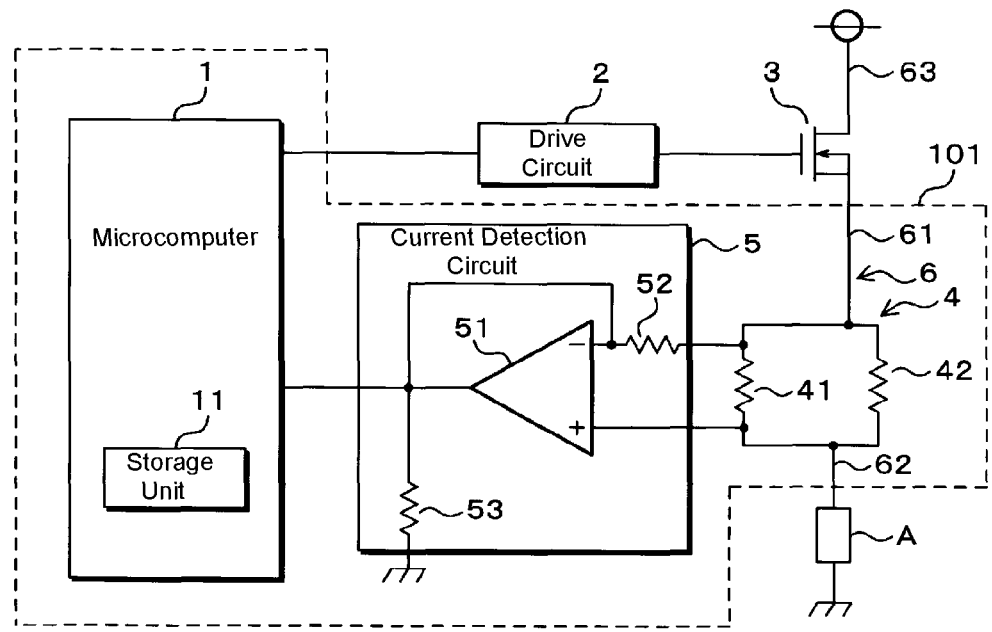
FIG. 1 is a circuit block diagram showing a configuration example of a power supply control apparatus according to a first embodiment.

First, embodiments of the present disclosure will be listed and described. Also, at least some of the embodiments described below may be combined as appropriate.

In a first aspect, current detection apparatus according to the present aspect is a current detection apparatus for detecting current flowing through a power supply path of a power supply control apparatus, in which the power supply path includes a first conductor and a second conductor, the current detection apparatus further includes: a first shunt resistor and a second shunt resistor that are connected in parallel between the first conductor and the second conductor; a current detection circuit configured to detect current flowing through the first shunt resistor; and an arithmetic circuit, and the arithmetic circuit calculates current flowing through the power supply path based on a correlation between current flowing from the first conductor to the second conductor via both the first shunt resistor and the second shunt resistor and current flowing through the first shunt resistor, and the current detected by the current detection circuit.

According to the present aspect, the current flowing through the first conductor and the second conductor forming the power supply path is divided and flows to the first shunt resistor and the second shunt resistor. The current detection circuit is provided in the first shunt resistor and detects the current flowing through the first shunt resistor. The current detection circuit is not provided in the second shunt resistor.

The current flowing in the first shunt resistor and the current flowing in the second shunt resistor are subjected to non-uniform flow if there is a difference in the resistance values of the respective current paths. The arithmetic circuit calculates the current flowing through the power supply path based on the correlation between the current flowing through the power supply path and the current flowing through the first shunt resistor, and based on the current of the first shunt resistor.

Note that the number of shunt resistors in the present embodiment is not limited to two.

in a second aspect, a configuration is preferable in which a first path in which current flows through the power supply path via the first shunt resistor has a smaller current division ratio than a second path in which current flows through the power supply path via the second shunt resistor.

In a third aspect, a configuration is preferable in which a path resistance of the first path in which current flows through the power supply path via the first shunt resistor is greater than a path resistance of the second path in which current flows through the power supply path via the second shunt resistor.

In a fourth aspect, a configuration is preferable in which the first path in which current flows through the power supply path via the first shunt resistor is longer than a second path in which current flows through the power supply path via the second shunt resistor.

According to the present aspect, the current flowing through the power supply path of the power supply control apparatus is divided on the two above-described paths, and the current flowing through the first path is smaller than the current flowing through the second path.

If the arithmetic circuit calculates the current flowing through the power supply path assuming that the ratio of the currents flowing through the two paths is 50:50, the current flowing through the power supply path is calculated with a smaller value.

According to the above-described aspect, if the arithmetic circuit performs processing for turning off a semiconductor switching element that cuts off the power supply path when it has been determined that the current flowing through the power supply path is a predetermined threshold value or more, it is possible to prevent erroneous cutoff of the power supply path.

In a fifth aspect, a configuration is preferable in which the distance between the first shunt resistor and the second shunt resistor is 5 mm or less.

According to the present aspect, since the distance between the first shunt resistor and the second shunt resistor is 5 mm or less, it is possible to suppress non-uform flow of the current flowing through the first shunt resistor and the current flowing through the second shunt resistor, and the arithmetic circuit can more accurately calculate the current flowing through the power supply path.

Note that the resistance values of the first shunt resistor and the second shunt resistor are, for example, at least 0.5 mΩ and at most 10 mΩ, and the resistance values of the first conductor and the second conductor are smaller than the resistance values of the first shunt resistor and the second shunt resistor.

The power supply control apparatus according to the present aspect includes the current detection apparatus according to any one of aspects above.

According to the present aspect, it is possible perform power supply control for a large current flowing through the power supply path via the first and second shunt resistors, which are connected in parallel.

Specific examples of the current detection apparatus and the power supply control apparatus according to an embodiment of the present disclosure will be described below with reference to the drawings. It should be noted that the present invention is not limited to these examples, but is indicated by the claims, and modifications within the meaning and scope equivalent to the claims are intended to be encompassed therein.

Hereinafter, the present disclosure will be specifically described with reference to drawings showing embodiments thereof.

First Embodiment

FIG. 1 is a circuit block diagram showing a configuration example of a power supply control apparatus according to a first embodiment. The power supply control apparatus of the first embodiment is an apparatus that controls power supply from a vehicle-mounted battery (not shown) to a load A. The power supply control apparatus includes a microcomputer (arithmetic circuit) 1, a drive circuit 2, a semiconductor switching element 3, a shunt resistor 4, a current detection circuit 5, and a power supply path 6. The microcomputer 1, the shunt resistor 4, and the current detection circuit 5 constitute a current detection apparatus 101 according to the first embodiment.

The power supply path 6 is a conductor that supplies electric power from the vehicle-mounted battery to the load A, and includes a first conductor 61, a second conductor 62, and a third conductor 63 that are connected in series. The first conductor 61, the second conductor 62, and the third conductor 63 are, for example, flat plate-shaped conductors. The first conductor 61 is connected to the second conductor 62 via the shunt resistor 4. Also, the first conductor 61 is connected to the third conductor 63 via the semiconductor switching element 3. The third conductor 63 is connected to the positive terminal of the vehicle-mounted battery, and the second conductor 62 is connected to the positive terminal of the load A.

The semiconductor switching element 3 is, for example, an N-channel power MOSFET. The drain of the semiconductor switching element 3 is connected to the third conductor 63, and the source is connected to the first conductor 61. That is, the drain of the semiconductor switching element 3 is connected to the positive terminal side of the vehicle-mounted battery via the third conductor 63, and the source is connected to the positive terminal of the load A via the first conductor 61. The negative terminal of the vehicle-mounted battery and the negative terminal of the load A are grounded.

The drive circuit 2 is connected to the gate of the semiconductor switching element 3. The drive circuit 2 turns on or off the semiconductor switching element 3 based on a PWM signal provided by the microcomputer 1.

The shunt resistor 4 includes a first shunt resistor 41 and a second shunt resistor 42, which are connected in parallel between the first conductor 61 and the second conductor 62. Specifically, one end of the first shunt resistor 41 is connected to the first conductor 61, and the other end of the first shunt resistor 41 is connected to the second conductor 62.

Similarly, one end of the second shunt resistor 42 is connected to the first conductor 61, and the other end of the second shunt resistor 42 is connected to the second conductor 62. The first shunt resistor 41 and the second shunt resistor 42 are, for example, at least 0.5 mΩ and at most 10 mΩ.

The current detection circuit 5 is a circuit that detects current flowing through the first shunt resistor 41 by detecting the voltage across the first shunt resistor 41, and outputs a voltage corresponding to the current to the microcomputer 1. The power supply control apparatus according to the first embodiment includes a single current detection circuit 5, and the single current detection circuit 5 is provided on the first shunt resistor 41 side.

An example of the current detection circuit 5 will be described. The current detection circuit 5 includes a differential amplifier 51 and forms an inverting amplifier circuit. The non-inverting input terminal of the differential amplifier 51 is connected to the negative end of the first shunt resistor 41. The inverting input terminal of the differential amplifier 51 is connected to the positive end of the first shunt resistor 41 via an electric resistor 52. The output terminal of the differential amplifier 51 is grounded via an electric resistor 53 and is connected to the inverting input terminal, and thus negative feedback is applied. The voltage output from the output terminal of the differential amplifier 51 corresponds to the value of the current flowing through the power supply path 6, and is input to the microcomputer 1.

Figure 2:
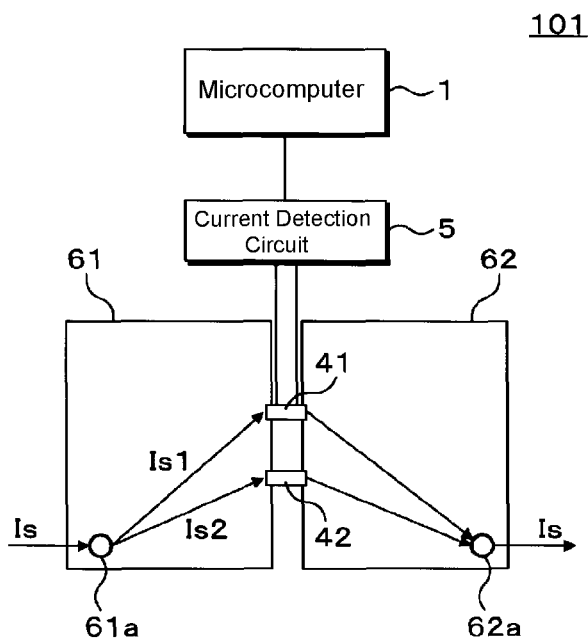
FIG. 2 is a schematic diagram showing a configuration example of a current detection apparatus according to the first embodiment.
Figure 3:
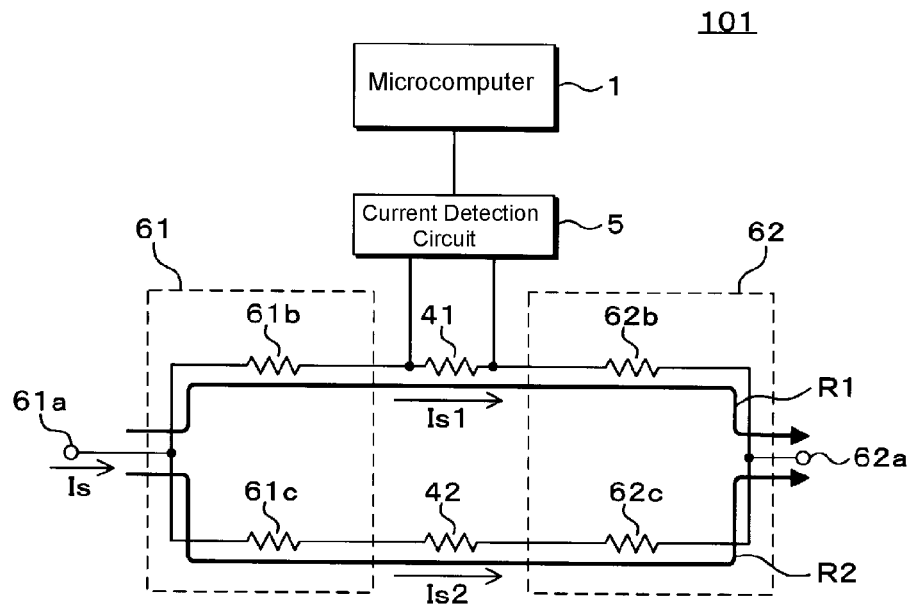
FIG. 3 is a circuit block diagram showing a configuration example of the current detection apparatus according to the first embodiment.

FIG. 2 is a schematic diagram showing a configuration example of the current detection apparatus 101 according to the first embodiment, and FIG. 3 is a circuit block diagram showing a configuration example of the current detection apparatus 101 according to the first embodiment. A first path R1 in which current flows through the power supply path 6 via the first shunt resistor 41 has a longer circuit configuration than a second path R2 in which current flows through the power supply path 6 via the second shunt resistor 42. In other words, the first path R1 is a path having a smaller current division ratio than the second path R2, and thus a current Is1 and a current Is2 are subjected to non-uniform flow. It can also be said that the path resistance of the first path R1 is greater than the path resistance of the second path R2.

The first path R1 is generally a path connecting an inflow point 61a where the current flows into the first conductor 61, the first shunt resistor 41, and an outflow point 62a where the current flows out from the second conductor 62, and as shown in FIG. 3, the path is represented by an electric resistor 61b of the first conductor 61, the first shunt resistor 41, and an electric resistor 62b of the second conductor 62.

The second path R2 is generally a path connecting the inflow point 61a, the second shunt resistor 42, and the outflow point 62a, and as shown in FIG. 3, the path is represented by an electric resistor 61c of the first conductor 61, the second shunt resistor 42, and an electrical resistor 62c of the second conductor 62.

The current Is flowing into the inflow point 61a is divided into a current Is1 flowing through the first path R1 and a current Is2 flowing through the second path R2. Since the electric resistor 61b is larger than the electric resistor 61c and the electric resistor 62b is larger than the electric resistor 62c, the current Is1 flowing through the first path R1 is smaller than the current Is2 flowing through the second path R2. That is, the current Is1 and the current Is2 are subjected to non-uniform flow.

If the non-uniform flow is too large, the heat generated on the side where the large current is flowing increases, and the current that can be supplied becomes small, and therefore it is preferable to use the following configuration in order to reduce non-uniform flow as much as possible.

It is preferable that the first shunt resistor 41 and the second shunt resistor 42 have substantially the same resistance value. Also, it is preferable to use a configuration in which the distance between the first shunt resistor 41 and the second shunt resistor 42 is, for example, 5 mm or less. Furthermore, it is preferable to use a configuration in which the first shunt resistor 41 and the second shunt resistor 42 are arranged in parallel. Specifically, it is preferable to use an arrangement in which the first shunt resistor 41 and the second shunt resistor 42 have flat approximate cuboid shapes, the long sides of the first shunt resistor 41 and the second shunt resistor 42 are substantially parallel, and the short sides of the first shunt resistor 41 and the second shunt resistor 42 are flush with each other.

Also, as shown in FIGS. 2 and 3, it is preferable to use a configuration in which the current detection circuit 5 is provided on the first shunt resistor 41 side, where the path is long. Using the first shunt resistor 41, where the path through which the current flows is long, results in higher current detection accuracy and makes it possible to prevent erroneous control by the microcomputer 1.

The microcomputer 1 includes a storage unit 11 for storing the correlation between a current Is=Is1+Is2 flowing from the first conductor 61 to the second conductor 62 via both the first shunt resistor 41 and the second shunt resistor 42, and a current Is1 flowing through the first shunt resistor 41. The correlation is, for example, the ratio of the current Is and the current Is1 (=Is/Is1). The microcomputer 1 calculates the current Is flowing through the power supply path 6 based on the correlation stored in the storage unit 11 and the current Is1 detected by the current detection circuit 5.

If the microcomputer 1 determines that the current Is flowing in the power supply path 6 is a predetermined threshold value or more, the microcomputer 1 outputs a cutoff signal to the drive circuit 2 and turns off the semiconductor switching element 3. Also, the microcomputer 1 estimates the temperature of the conductive wire connecting the vehicle-mounted battery and the load A based on the current Is and the current application time, and if the estimated electric wire temperature is a predetermined threshold value or more, the microcomputer 1 turns off the semiconductor switching element 3 to protect the wire.

Also, the microcomputer 1 performs PWM control of the power supply to the load A by outputting a PWM signal to the drive circuit 2 and turning the semiconductor switching element 3 on and off.

The drive circuit 2 drives the semiconductor switching element 3 on by raising the gate voltage of the semiconductor switching element 3 with reference to the ground potential.

According to the current detection apparatus 101 and the power supply control apparatus according to the first embodiment configured in this manner, it is possible to detect a large current that cannot be detected with one shunt resistor by merely including one current detection circuit 5 for the first shunt resistor 41 and the second shunt resistor 42, which are connected in parallel.

Also, if the current detection circuit 5 is provided on the first shunt resistor 41 side on which the path flowing through the first conductor 61 and the second conductor 62 is long, and the microcomputer 1 is configured to calculate the current flowing through the power supply path 6 with the ratio between the current Is1 flowing through the first path R1 and the current Is2 flowing through the second path R2 set to 50:50, the current flowing through the power supply path 6 is calculated with a smaller value, and therefore it is possible to prevent erroneous cutoff due to overcurrent.

Note that it is also possible to provide the current detection circuit 5 on the second shunt resistor 42 in the first embodiment.

Furthermore, by employing a configuration that suppresses non-uniform flow by setting the distance between the first shunt resistor 41 and the second shunt resistor 42 to 5 mm or less or the like, current can be detected more accurately and power supply control can be performed. Also, by suppressing non-uniform flow, the current can be divided to the first shunt resistor 41 and the second shunt resistor 42 in a well-balanced manner, and a larger current can be controlled.

Second Embodiment

Figure 4:
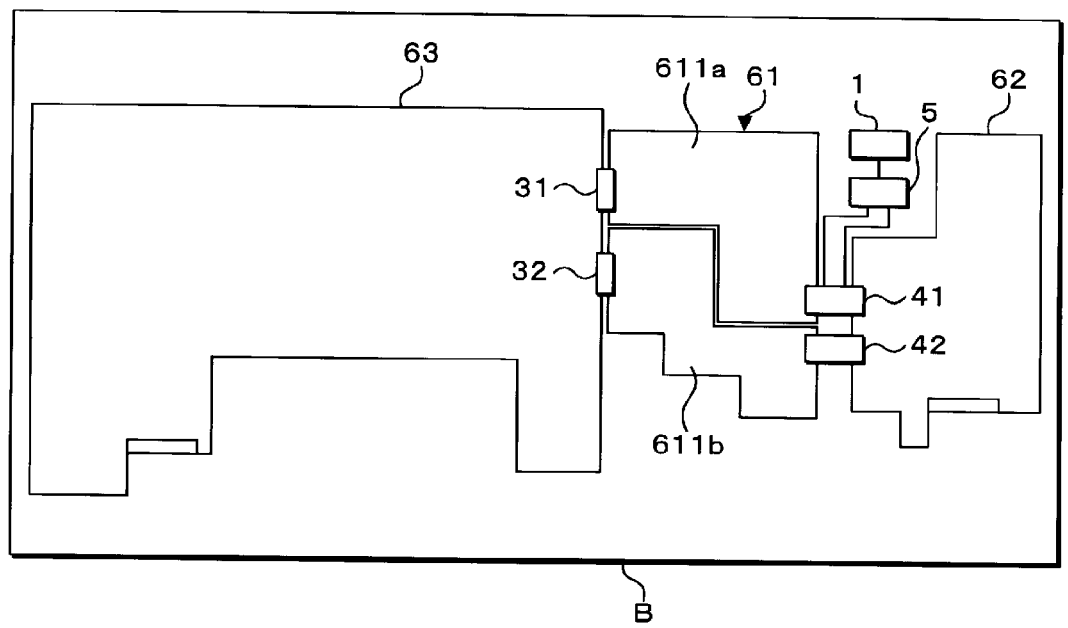
FIG. 4 is a schematic diagram showing a configuration example of the current detection apparatus according to a second embodiment.

FIG. 4 is a schematic diagram showing a configuration example of the current detection apparatus 101 according to a second embodiment. The current detection apparatus 101 and the power supply apparatus according to the second embodiment are different from the first embodiment in that they include a first semiconductor switching element 31 and a second semiconductor switching element 32 that are connected in parallel, and therefore mainly the above-described difference will be described below. Since other configurations, operations, and effects are the same as those in the first embodiment, corresponding parts are denoted by the same reference numerals and detailed description thereof is omitted.

A first conductor 61, a second conductor 62, a third conductor 63, a first semiconductor switching element 31, a second semiconductor switching element 32, a first shunt resistor 41, a second shunt resistor 42, a microcomputer 1, and a current detection circuit 5 are arranged on a substrate B.

The semiconductor switching element 3 includes the first semiconductor switching element 31 and the second semiconductor switching element 32 that are connected in parallel between the first conductor 61 and the third conductor 63. The first conductor 61 has two separate conductor portions 611a and 611b. The source of the first semiconductor switching element 31 is connected to the first conductor portion 611a, and the source of the second semiconductor switching element 32 is connected to the second conductor portion 611b. The first shunt resistor 41 is connected to the first conductor portion 611a and the second shunt resistor 42 is connected to the second conductor portion 611b.

According to the second embodiment, it is possible to suppress non-uniform flow with a configuration in which there is a high degree of freedom in the arrangement of the first semiconductor switching element 31 and the second semiconductor switching element 32, and the current flowing through the power supply path 6 can be calculated more accurately.

Modified Example

Figure 5A:
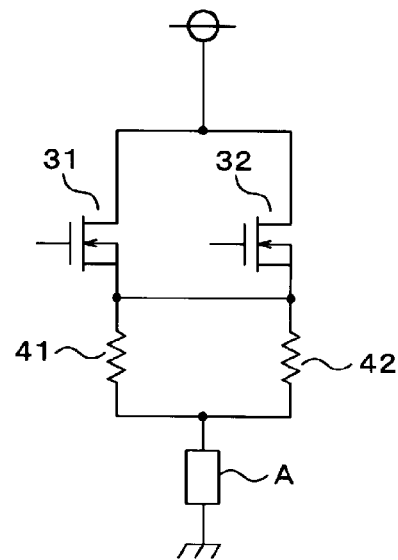
FIG. 5A is a circuit diagram showing a portion of a current detection apparatus according to a modified example.
Figure 5B:
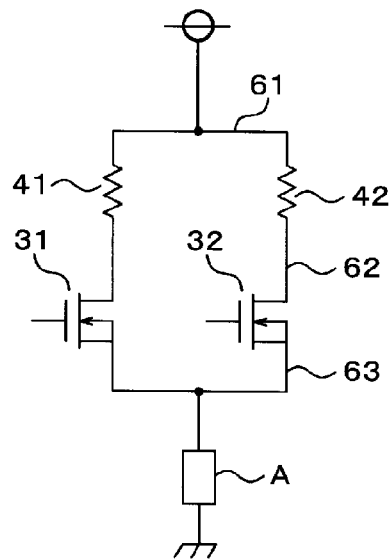
FIG. 5B is a circuit diagram showing a portion of a current detection apparatus according to a modified example.

FIGS. 5A and 5B are circuit diagrams showing a portion of the current detection apparatus 101 according to a modified example.

In the configuration according to the second embodiment, as shown in FIG. 5A, it is also possible to use a configuration in which the source of the first semiconductor switching element 31 and the source of the second semiconductor switching element 32 are connected by a conductor. In this case, non-uniform flow of the current flowing through the first shunt resistor 41 and the current flowing through the second shunt resistor 42 can be suppressed more effectively. Also, heat can be dissipated from the conductor, and a configuration having excellent heat dissipation properties can be obtained.

As shown in FIG. 5B, the first shunt resistor 41 and the second shunt resistor 42 may be connected to the positive side, and the first semiconductor switching element 31 and the second semiconductor switching element 32 may be connected to the negative side. Specifically, the first conductor 61 is connected to the positive terminal of the vehicle-mounted battery, and the first conductor 61 and the second conductor 62 are connected via the first shunt resistor 41 and the second shunt resistor 42. The second conductor 62 and the third conductor 63 are connected via the first semiconductor switching element 31 and the second semiconductor switching element 32, and the third conductor 63 is connected to the positive terminal of the load A.

In the modified example as well, the power supply control apparatus and the current detection apparatus 101 have the same operations and effects as in the first and second embodiments.

The invention claimed is:

1. A current detection apparatus for detecting current flowing through a power supply path of a power supply control apparatus,
wherein the power supply path includes a flat plate-shaped first conductor, second conductor, and third conductor that are arranged on a substrate,
the current detection apparatus further comprises:
a first semiconductor switching element and a second semiconductor switching element that are connected in parallel between the first conductor and the third conductor arranged on the substrate,
a first shunt resistor and a second shunt resistor that are connected in parallel between the first conductor and the second conductor arranged on the substrate;
a current detection circuit that is arranged on the substrate and is configured to detect current flowing through the first shunt resistor; and
an arithmetic circuit arranged on the substrate, and
the arithmetic circuit calculates current flowing through the power supply path based on a correlation between current flowing from the first conductor to the second conductor via both the first shunt resistor and the second shunt resistor and current flowing through the first shunt resistor, and the current detected by the current detection circuit.

2. The current detection apparatus according to claim 1, wherein a first path in which current flows through the power supply path via the first shunt resistor has a smaller current division ratio than a second path in which current flows through the power supply path via the second shunt resistor.

3. The current detection apparatus according to claim 2, wherein a path resistance of the first path in which current flows through the power supply path via the first shunt resistor is greater than a path resistance of the second path in which current flows through the power supply path via the second shunt resistor.

4. The current detection apparatus according to claim 2, wherein the first path in which current flows through the power supply path via the first shunt resistor is longer than a second path in which current flows through the power supply path via the second shunt resistor.

5. The current detection apparatus according to claim 2, wherein the distance between the first shunt resistor and the second shunt resistor is 5 mm or less.

6. The current detection apparatus according to claim 1, wherein a path resistance of the first path in which current flows through the power supply path via the first shunt resistor is greater than a path resistance of the second path in which current flows through the power supply path via the second shunt resistor.

7. The current detection apparatus according to claim 6, wherein the first path in which current flows through the power supply path via the first shunt resistor is longer than a second path in which current flows through the power supply path via the second shunt resistor.

8. The current detection apparatus according to claim 6, wherein the distance between the first shunt resistor and the second shunt resistor is 5 mm or less.

9. The current detection apparatus according to claim 1, wherein the first path in which current flows through the power supply path via the first shunt resistor is longer than a second path in which current flows through the power supply path via the second shunt resistor.

10. The current detection apparatus according to claim 9, wherein the distance between the first shunt resistor and the second shunt resistor is 5 mm or less.

11. The current detection apparatus according to claim 1, wherein the distance between the first shunt resistor and the second shunt resistor is 5 mm or less.

12. A power supply control apparatus including the current detection apparatus according to claim 1.

13. The power supply control apparatus according to claim 12, wherein a first path in which current flows through the power supply path via the first shunt resistor has a smaller current division ratio than a second path in which current flows through the power supply path via the second shunt resistor.

14. The power supply control apparatus according to claim 12, wherein a path resistance of the first path in which current flows through the power supply path via the first shunt resistor is greater than a path resistance of the second path in which current flows through the power supply path via the second shunt resistor.

15. The power supply control apparatus according to claim 12, wherein the first path in which current flows through the power supply path via the first shunt resistor is longer than a second path in which current flows through the power supply path via the second shunt resistor.

* * * * *